(12) United States Patent
Chang et al.

(10) Patent No.: US 8,773,307 B2
(45) Date of Patent: Jul. 8, 2014

(54) WIDE NULL FORMING SYSTEM WITH BEAMFORMING

(75) Inventors: Donald C. D. Chang, Thousand Oaks, CA (US); Yulan Sun, Canoga Park, CA (US); Yuanchang Liu, Canogan Park, CA (US)

(73) Assignee: Spatial Digital Systems, Inc., Camarillo ( * ) Notice: Subject to any disclaimer, the term of this patent is extended or adjusted under 35 U.S.C. 154(b) by 430 days.

(21) Appl. No.: 12/952,029

(22) Filed: Nov. 22, 2010

(65) Prior Publication Data

US 2012/0063542 A1    Mar. 15, 2012

Related U.S. Application Data

(60) Provisional application No. 61/381,381, filed on Sep. 9, 2010.

(51) Int. Cl.
*G01S 3/16* (2006.01)
*H01Q 3/00* (2006.01)

(52) U.S. Cl.
USPC .......................................... 342/383; 342/373

(58) Field of Classification Search
CPC ......... G01S 1/00; G01S 13/24; H01Q 3/2611; H01Q 3/40
USPC ................... 342/368, 370, 383, 81, 154, 373; 455/87
See application file for complete search history.

(56) References Cited

U.S. PATENT DOCUMENTS

| | | | |
|---|---|---|---|
| 5,579,016 A | 11/1996 | Wolcott et al. | |
| 6,970,722 B1 * | 11/2005 | Lewis | ........................ 455/562.1 |
| 7,117,018 B2 | 10/2006 | Lewis | |
| 7,301,920 B2 * | 11/2007 | Sanders et al. | ................ 370/328 |
| 2004/0204103 A1 * | 10/2004 | Rouphael | ................... 455/562.1 |

OTHER PUBLICATIONS

Wei Wei, Ma Hong, Sun Mingquan, "An Improved Adaptive Null Forming Algorithm in Wireless Communication," Communications and Networking in China, 2006, pp. 2-6, ChinaCom '06.

* cited by examiner

*Primary Examiner* — Dao Phan

(57) ABSTRACT

A novel wide null forming system achieves both wide bandwidth and beam width null through employing an antenna array to receive and transmit signals to which a complex null weight vector, calculated by perturbation program, is applied. The novel wide null forming system includes a multiple-element antenna array for receiving or transmitting signals. Multiple conditioning units matching the number of elements is present to condition the signals for proper reception and analysis, after which a series of complex multiplier processors adds complex weights. After being weighted each constituent beam is combined in an adding processor to form one composite beam for use by the user.

20 Claims, 6 Drawing Sheets

Fig 1: Prior Art

WIDE NULL FORMING SYSTEM WITH BEAMFORMING

RELATED APPLICATION DATA

This application claims the benefit, pursuant to 35 U.S.C. §119(e), of U.S. provisional application Ser. No. 61/381,381, filed Sep. 10, 2010.

BACKGROUND

1. Field

The present invention relates to archite ctures and methods of wireless communication systems. More specifically, but without limitation thereto, the present invention pertains to a communication system and method that allows an antenna element to create a radiation notch when transmitting or receiving radio waves in order to improve gain and signal strength in a desired direction while reducing or eliminating interference from undesired sources and directions.

2. Prior Art

The following is a tabulation of some prior art that presently appears relevant:

| U.S. Patents | | |
| --- | --- | --- |
| Patent Number | Kind Code | Issue Date |
| 5,579,016 | | 1996 Nov. 26 |
| 6,970,722 | B1 | 2005 Nov. 29 |
| 7,117,018 | B2 | 2006 Oct. 03 |

Non-Patent Literature Documents

Wei Wei, Ma Hong, Sun Mingquan, *Communications and networking in China, 2-6. ChinaCom '06. First International Conference On*, "An Improved adaptive Null Forming Algorithm in Wireless Communication" (2006)

In the field of wireless communications and satellite communications design, beam forming is a well-known technique for improving signal quality and transmission integrity. Utilizing antenna arrays employing multiple feed elements, beam forming is used to improve antenna directivity and gain significantly for both transmitting and receiving ends as all power is concentrated into a narrower beam of radio signals. Additionally, beam forming provides beam steering capability. These sorts of advantages translate into several things. Improving directivity and gain means improved signal strength for both transmission and reception functions due to signal concentration. Beam steering capability means that the antenna can focus its signals into a beam and point the signal in a desired direction, rather than radiating in all directions that the antenna is pointing. This not only does this reduce signal leakage, but also gives the user the ability to send the signal where they desire.

The massive proliferation of digital devices and radio frequency-based communications has led to increasing demand for wireless communication technologies. Additionally, competition for bandwidth and coverage among service providers becomes more intense. Finite amounts of digital and physical space means that there is bandwidth usage overlap, or lack of geostationary orbit (GEO) slots for satellites, the most desirable slots for communications satellites. The satellites must be placed 2° apart due to the possibility of interference, considering different companies may share the same bandwidth. As a result, competition for coverage areas is very high, necessitating research into better methods for interference isolation, leading to another technique called null forming.

Null forming is a method of forming a radiation notch in a desired direction, able to be used by both transmitting and receiving ends. Null forming creates an area where the radiation does not transmit, essentially creating a signal blind spot to shape coverage. On the other hand, null forming for the receiver entails rejection of interference from certain directions. FIG. 1 shows a radiation pattern using an older single null forming technique, with a null formed on −2°. As shown in FIG. 1, previous methods of single null forming produce very narrow nulls both in spatial and in frequency terms. Such results limit the benefits of null forming for two aspects. First, the function of a radiation null depends on the precise location of the target. A little spatial variation of the target will lead it out of the null range, voiding the rejection. Second, the null position is very sensitive to frequency. Even a small variation of the operating frequency will shift the null position. Thus, the single null forming technique only works for narrow band signals. Otherwise, only part of the interference is rejected while the rest still causes signal leakage. As a result, previous single null forming techniques only work for precisely located narrow band signals. This is often inadequate for wireless communication applications.

As a result, research has been performed to find a way to create wider nulls that meet the demanding requirements for wireless communications use. For example, U.S. Pat. No. 6,970,722 (2005), U.S. Pat. No. 7,117,018 (2006) both attributed to Lewis. Although he claims he could steer a wide deep null, Lewis's patent concentrates on steering a null rather than how to form a wide null. And admittedly, in Wei Wei et al.'s paper, "An Improved adaptive Null Forming Algorithm in Wireless Communication", the author successfully broadens the null width. However, the improvement is not good enough for today's demanding requirements.

The present invention is a null forming technique aimed at creating a system that addresses the shortcomings of previous inventions. The present invention is capable of both wide null forming and beam steering capabilities, combining the innovations secured by both Lewis and Wei into a single system.

SUMMARY OF THE INVENTION

In accordance with one embodiment, the present invention provides a dynamic communication system that focuses on creating a series of wide nulls by an antenna system to either prevent signal transmission in certain directions or to reduce incoming interference from undesired directions while maintaining beam steering capability.

More specifically, the present invention is a null forming system for either receiving or transmitting signals. The receiving system is comprised of multiple antenna elements forming an array, a series of signal pre-processors, a series of complex multiplier processors, and an adder processor. The system functions by receiving radio signals via the antenna elements, which are then "conditioned" to a usable signal via the pre-processors. The signals then enter the complex multiplier processor, where each constituent signal is assigned a null weight vector and undergoes a complex perturbation program until the weight vectors meet a desired set of requirements. The signals are then summed in the adding processor.

On the other hand, the null forming processor for transmission of signals comprises 1 to N splitter, a series of complex multipliers, a series of transmitting post-processors, and a multiple element antenna array. The transmitting system functions as such: the signal to be transmitted to an external source enters the 1 to N splitter where the constituent signal is split into multiple channels. Then, the signals are complex-multiplied, given a weight vector, and run through a perturbation program just like the receiving array. A post-processor re-conditions the signal for transmission, with the antenna elements broadcasting the signal to a desired external receiver.

An alternative embodiment of the present invention aims to combine the function of the complex multiplier processor and adding processor into a single central processor. The rest of the embodiment remains the same, with the array elements feeding or receiving signals to and from a pre- or post-processor.

Another alternative embodiment is using the same setup as the previous embodiment, with the addition of an extra module. A dynamic optimizer is added for real-time re-calculation of signals as they are handled within the central processor. The addition of this module allows the null forming system to dynamically re-adjust the nulls based on real-time conditions.

Advantages

With the proposed algorithm to calculate weights for antennas, the null forming system may produce null patterns with the following advantages: wide null width, wide bandwidth capability, steerable nulls, cooperative null forming and beam forming.

Further advantages and applications of embodiments will become clear to those skilled in the art by examination of the following detailed. Reference will be made to the attached sheets of drawing that will first be described briefly.

Figure 1:
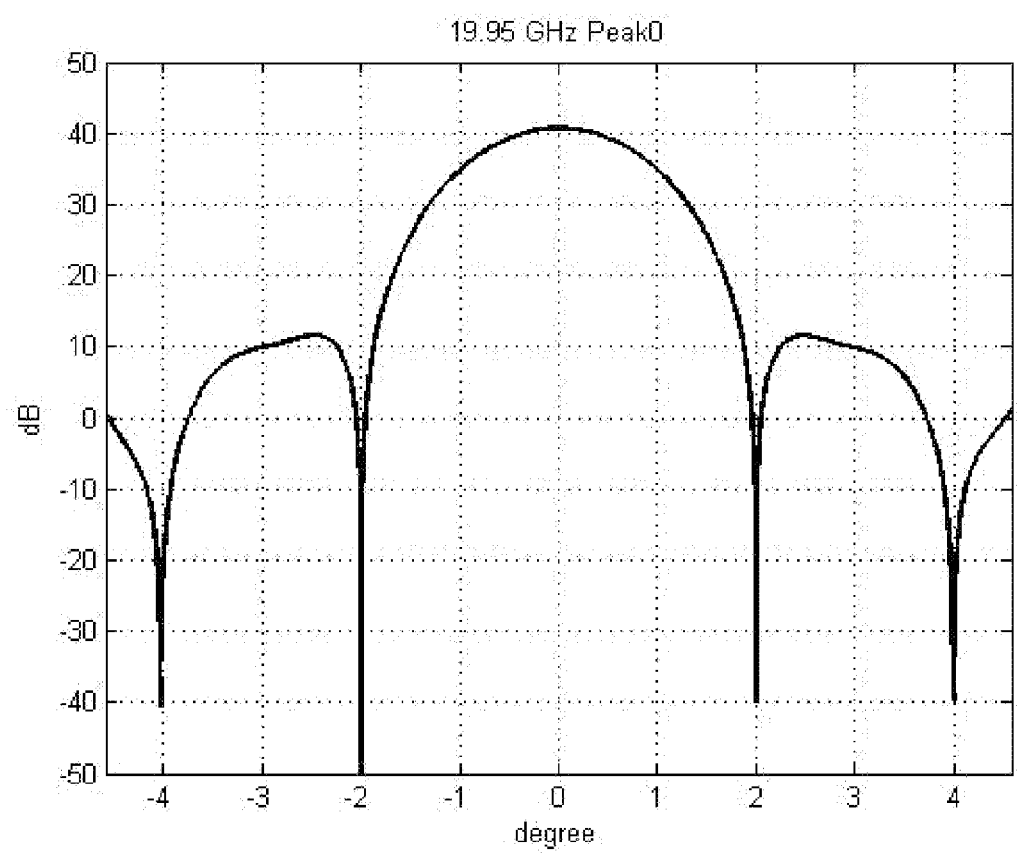
FIG. 1 illustrates a radiation pattern of prior art in which a single null is formed.

| DRAWINGS-Reference Numerals | | | |
|---|---|---|---|
| 202 | Radiation pattern plane cut of 19.95 GHz | 302 | Radiation pattern plane cut of 18.55 GHz |
| 402 | Receiving antenna array | 404 | Receiving pre-processor |
| 406 | Complex multiplier | 408 | Adder |
| 502 | Transmitting antenna array | 504 | Transmitting post-processor |
| 508 | 1 to N splitter | 602 | Antenna array |
| 604 | Signal processor | 606 | Central processor |
| 702 | Dynamic optimizer | | |

DETAILED DESCRIPTION OF THE PREFERRED EMBODIMENT

Prior works on null forming systems, like shown in FIG. 1, are mostly static, which means some fixed complex weights derived by a non-perfect process are applied to process signals, and they suffer from the following deficiencies: inability to adapt to environmental changes, narrow beam width, and narrow bandwidth.

Narrow beam width means a spatially narrow beam, while narrow bandwidth is a narrow beam in frequency. FIG. 1 shows a radiation pattern plane cut of prior null forming works. In the figure, horizontal axis represents geographical distance in terms of angle which is a popular scale in satellite communication. The vertical axis represents radiation power, in dB. Narrow beam width is obvious in FIG. 1 that at $-2°$ position, where a deep null is formed, $-10$ dB beam width is merely $0.01°$. In another respect, narrow bandwidth means the radiation notch is only valid at certain frequencies, 19.95 GHz in this case, and any change in frequency will lead to malfunction of the nulling system. Since satellites may move around their orbital slots in relation to the ground and usually possess a wide bandwidth, previous single null forming provides limited help to alleviate the problem nulling signals in certain directions. Additionally, satellites with single null forming capability lack the ability to dynamically adjust to environmental factors. One example of an environmental factor that can affect signal transmission is the Doppler Effect. If the relative velocity between a source and a destination is created or changed, variations of Doppler frequency will be introduced, leading to a different operation frequency. This phenomenon is relatively normal in wireless communications, considering that satellites are in motion, mobile ground terminals are used, among other things. As a result, if a static narrow bandwidth null is formed, the system may be prone to failure, as the null is geared for a certain frequency. Thus, single null forming systems do not adequately fulfill the role needed by current demands.

Figure 2:
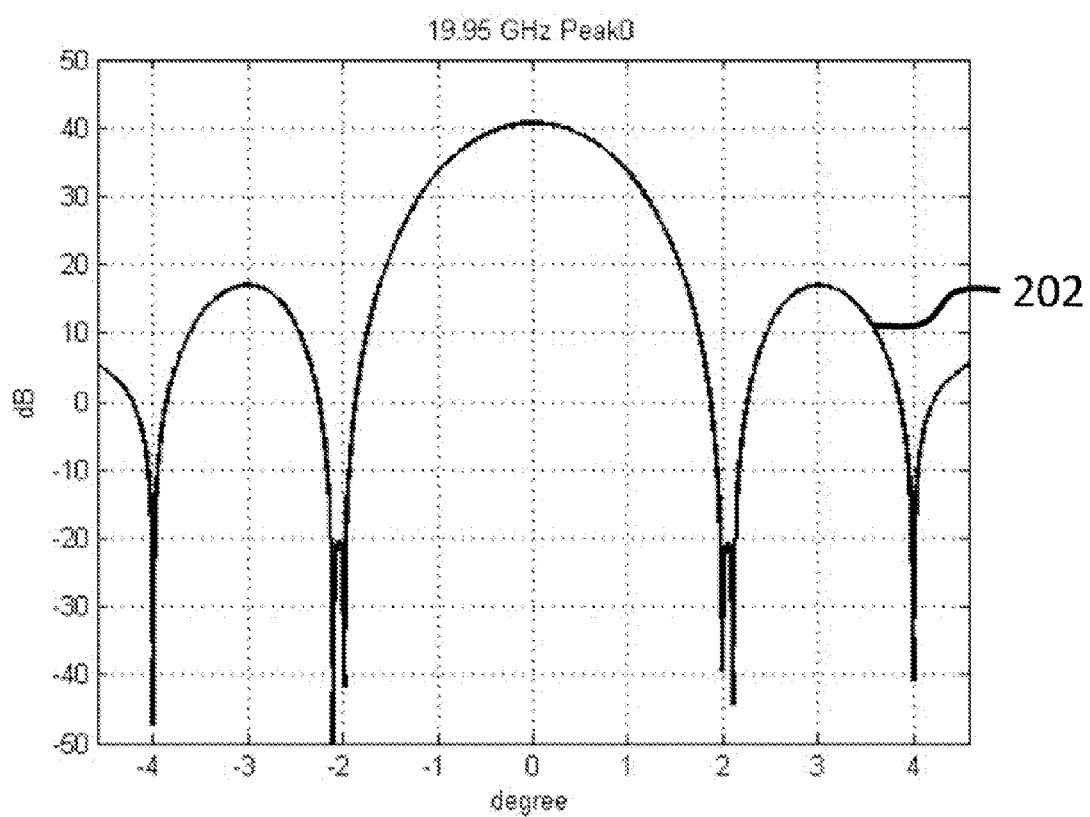
FIG. 2 depicts performance of present architecture at the same frequency with FIG. 1.

However, with the current invention, these disadvantages may be mitigated or eliminated altogether. In FIG. 2, 202 Radiation pattern plane cut of 19.95 GHz shows the same radiation plane cut with FIG. 1 but using this wide null forming system. It is clear that at $-2°$ position two nulls, but not limited to 2, are formed adjacently, and these nulls together form a larger one whose beam width is almost $0.4°$. Such a null width is wide enough to cover any satellite orbital slot wiggle relative to a ground observer. Any change greater than that will lead the signal to another orbital slot, which is a different topic not presently covered. Through such a means, narrow beam width deficiency is overcome.

Figure 3:
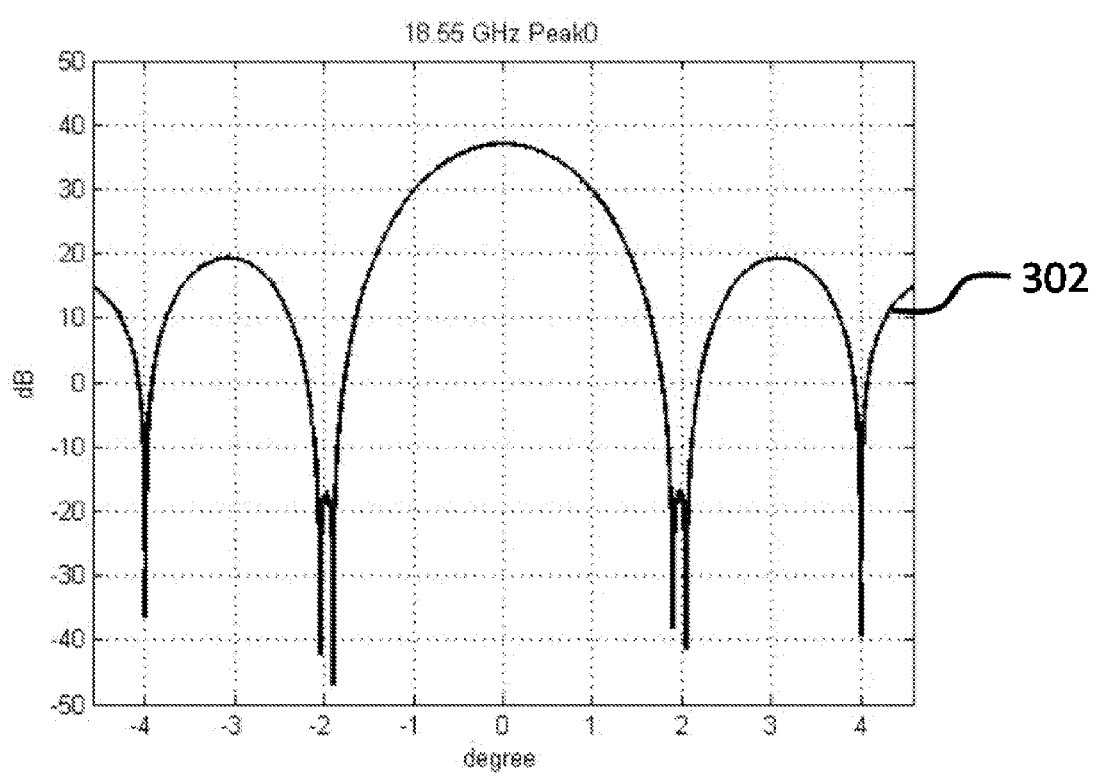
FIG. 3 shows performance of present architecture at a different frequency.

Additionally, this wide null forming mechanism remains working at a different frequency. In FIG. 3, radiation pattern plane 302 cut of 18.55 GHz shows a radiation pattern under the same setting with in FIG. 2 except at a different frequency. The nulls formed at $-2°$ and $2°$ move a little but still cover the desired directions. Thus, null performance at $-2°$ working at 18.55 GHz is unaffected. The forming of multiple nulls via the present invention helps overcome the bandwidth deficiency issue of single null systems. In other words, even wide band signals, like TV programs, could utilize benefits of nulling to shape their coverage.

Figure 4:
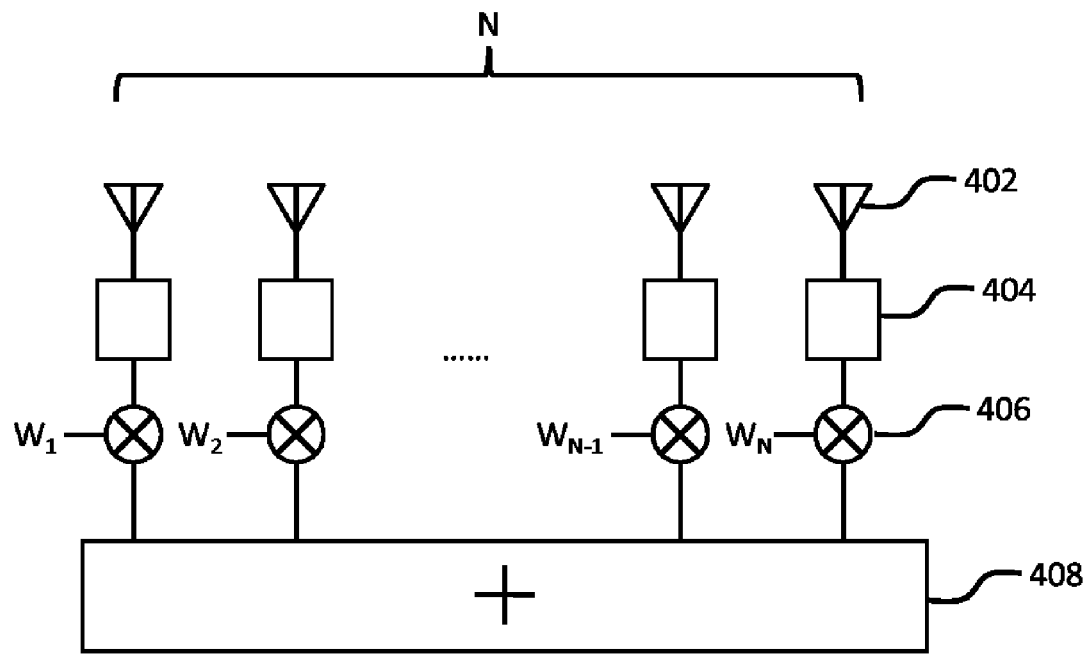
FIG. 4 presents receiving diagram of proposed architecture.

The physical system used to achieve these multiple nulls for satellite communications is depicted in FIG. 4, an embodiment of wide null system applied to signal receiving. First, receiving antenna array 402, comprised of multiple antenna elements, namely N in FIG. 4, is employed to receive incoming signals. These signals are then processed and "conditioned" through receiving pre-processor 404. Receiving pre-processor 404 may comprise any of the following: low noise amplifiers, down converters, and analog to digital converters. Low noise amplifiers are used to amplify incoming signals after transmitting through long distance. Down converters are used to convert high frequency signals to processable low frequency signals, for example, from 19.55 GHz to 32 MHz. Due to the current technical limits of carrier signal broadcast, they can only be transmitted in high frequencies. Analog to digital converters are used to transform analog signals into digital signals (of course, all processes here can be done in analog, but digital processing is used in this embodiment).

Figure 8:
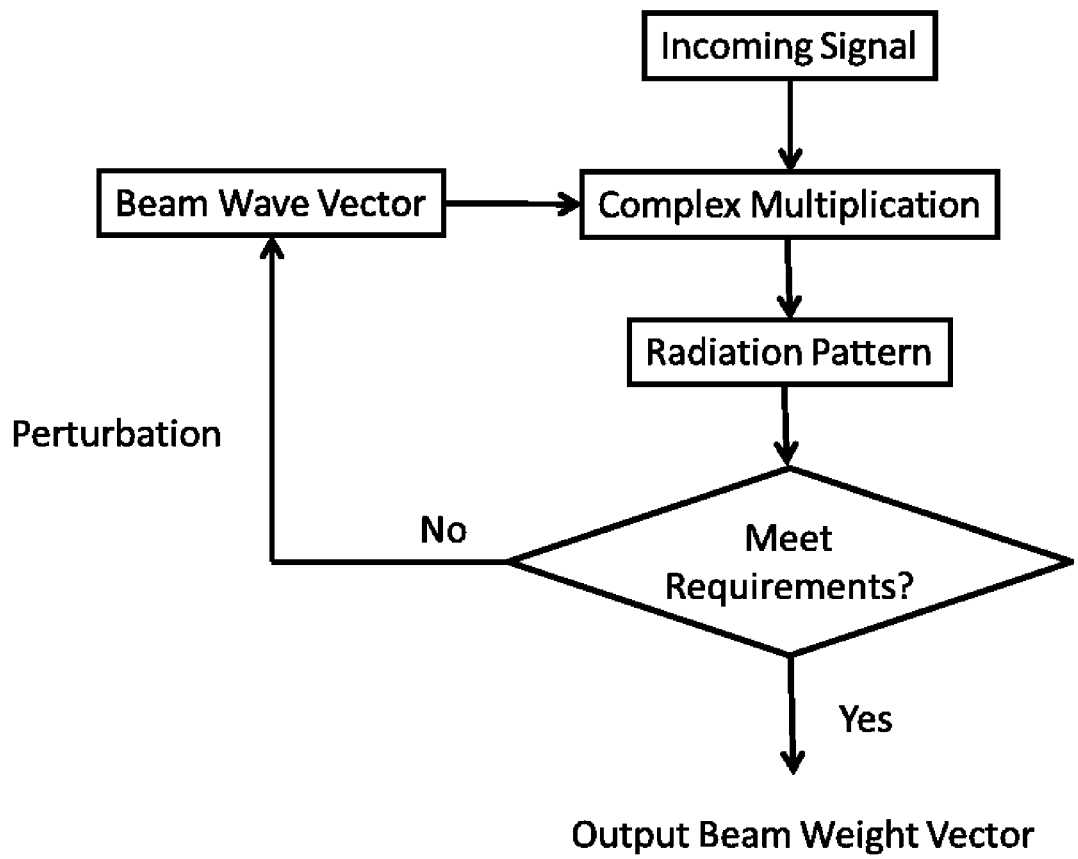
FIG. 8 shows diagram of optimization process.

After all signals are transformed into digital domain, complex multiplier 406 will be used to apply specially calculated null weight vectors, $W_1$ to $W_N$, to the digitized signals. The null weight vectors are generated by an adaptive perturbation program which continues to probe different null weight vectors until one set of vector satisfies requirements. In other words, the perturbation program will apply an initial set of null weight vectors to incoming signals and calculate radiation patterns. If the derived radiation pattern meets the requirement, the set of null weight vector will be passed to use. If not, current null weight vector will be modified, with recalculation of the radiation pattern until a suitable radiation patterned is found, as shown in FIG. 8. Then adder processor 408 will sum up all signals into a final output signal.

Figure 5:
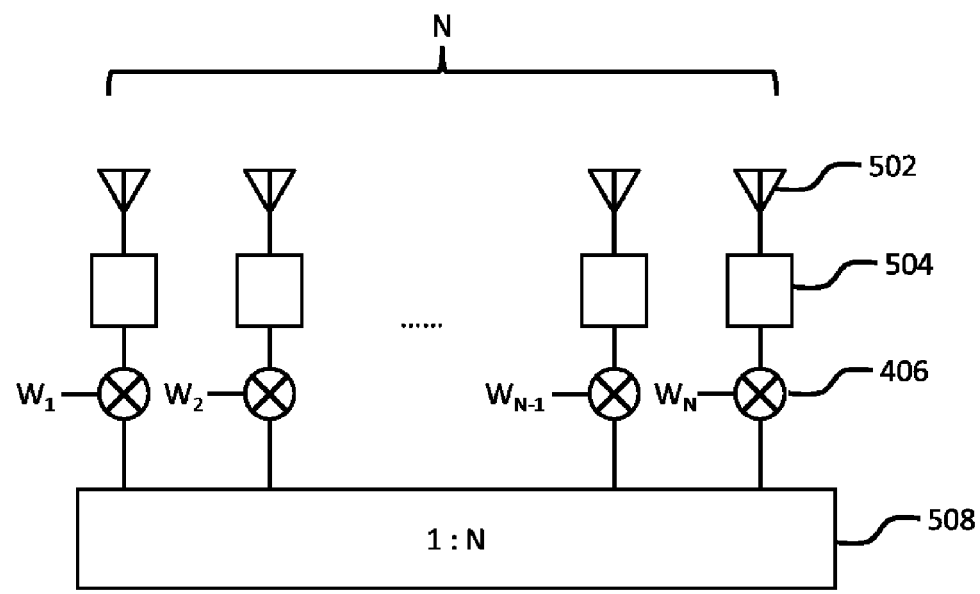
FIG. 5 presents transmitting diagram of proposed architecture.

Previous demonstration is all about receiving signals, to which the transmitting of signals with the null forming system is very similar. FIG. 5 is an exemplary block diagram of null forming system for transmission. Transmission process is a reverse version of receiving one, from bottom to top, if looked at FIG. 5. First, instead of an adder 408, 1 to N splitter 508 is used to deliver the same source digital signal to N channels (again, this process can also be done in analogue format, but digital implementation is demonstrated here). Then a complex null weight vector, $W_1$ to $W_N$, will be applied through complex multiplier 406. The complex null weight vector is calculated using the perturbation program explained previously, and if using the same frequency and radiation pattern with receiving, transmission uses the same null weight vector too. Afterwards, transmitting post-processor 504, typically including digital to analog converters, up converters, and low noise amplifiers, will prepare and recondition weighted signals for transmission. Digital to analog converters are used to convert digital signals to analog signals for transmit; up converters are used to add high frequency carriers to the just converted signals; low noise amplifiers are used to amplify signals for long distance transmission. Lastly, all signals will go through transmitting antenna 502 for transmission.

Alternative Embodiment

Figure 6:
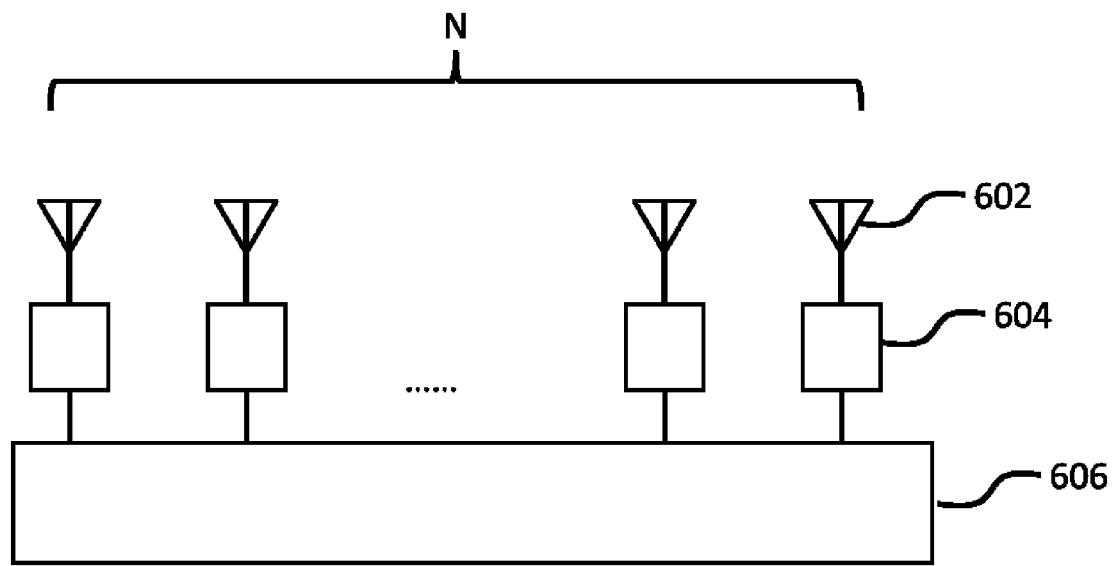
FIG. 6 illustrates an alternative embodiment for both receiving and transmitting.

Another embodiment is shown in FIG. 6. With currently developed technologies, all digital computations, such as previously discussed complex multiplication and summation, can be integrated in one central processor. For example, a microprocessor, including but not limited to, a digital signal processor (DSP), or a field programmable gate array (FPGA) may all be suitable candidates. Since these alternations only affect the digital domain, it can be applied to both transmit and receive functions.

For receiving, antenna array 602 receives incoming signals. Signal processor 604 performs the same function receiving pre-processor 404. Central processor 606 does the job of complex multiplication and summation as combination of complex multiplier 406 and adder 408.

For transmit functions, central processor 606 performs the job of splitter and complex multiplication as complex multiplier 406 and 1 to N splitter 508. Signal processor 604 performs the same function as post-processor 504. Antenna array 602 transmits outbound signals.

Alternative Embodiment 2

Figure 7:
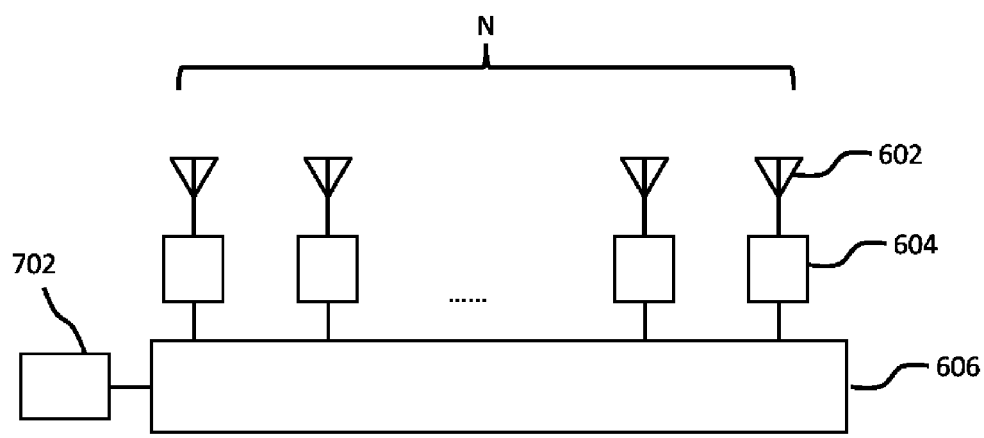
FIG. 7 demonstrates an alternative embodiment with real-time processing.

In this alternative embodiment, dynamic optimizer 702 is added as an additional module to the null forming system. As depicted in FIG. 7, the null forming system contains N number of antenna elements 702, connected to an equal number of signal processors 604, which in turn are all connected to central processor 606. Dynamic optimizer 702 is connected to central processor 606. Dynamic optimizer 702 is employed to calculate null weight vectors in real time. From an operational standpoint, dynamic optimizer 702 read signals from signal processor 604. Optimizer 702 then uses these signals to perturb null weight vectors until the set of complex vectors meets given requirements.

I claim:

1. A communication system configured to form a beam comprising a beam peak in a first direction, a first null in a second direction different from said first direction, a second null adjacent to said first null and a third null in a third direction different from said first and second directions, wherein said first and second directions are substantially 2 degrees apart in angle, wherein a first null width, at a radiation power below 50 dB from said beam peak, covering multiple nulls comprising said first and second nulls is greater than a second null width, at said radiation power, covering a single null that is said third null.

2. The communication system of claim 1 configured to form said beam further comprising a fourth null in a fourth direction different from said first, second and third directions and a fifth null adjacent to said fourth null, wherein a third null width, at said radiation power, covering multiple nulls comprising said fourth and fifth nulls is greater than said second null width.

3. The communication system of claim 2 configured to form said beam, wherein said fifth null is adjacent to said fourth null by an angle less than 0.5 degrees.

4. The communication system of claim 2 configured to form said beam further comprising a peak of a first side lobe between said first and second nulls in angle, wherein said peak of said first side lobe is at a gain level below greater than 50 dB from said beam peak, and a peak of a second side lobe between said fourth and fifth nulls in angle, wherein said peak of said second side lobe is at a gain level below greater than 50 dB from said beam peak.

5. The communication system of claim 1 configured to form said beam further comprising a peak of a side lobe between said first and second nulls in angle, wherein said peak of said side lobe is at a gain level below greater than 50 dB from said beam peak.

6. The communication system of claim 1 configured to form said beam, wherein said second null is adjacent to said first null by an angle less than 0.5 degrees.

7. A communication system configured to form a beam comprising a peak of a main lobe in a first direction, a first null in a second direction different from said first direction, a second null adjacent to said first null by an angle less than 0.5 degrees and a peak of a first side lobe between said first and second nulls in angle, wherein said peak of said first side lobe is at a gain level below greater than 40 dB from said peak of said main lobe.

8. The communication system of claim 7 configured to form said beam further comprising a third null in a third direction different from said first and second directions, a fourth null adjacent to said third null by an angle less than 0.5 degrees and a peak of a second side lobe between said third and fourth nulls in angle.

9. The communication system of claim 8 configured to form said beam, wherein said peak of said second side lobe is at a gain level below greater than 40 dB from said peak of said main lobe.

10. The communication system of claim 7 configured to form said beam, wherein said second null is adjacent to said first null by said angle less than 0.3 degrees.

11. The communication system of claim 7 configured to form said beam, wherein said peak of said first side lobe is at said gain level below greater than 50 dB from said peak of said main lobe.

12. The communication system of claim 7 configured to form said beam, wherein said first and second directions are substantially 2 degrees apart in angle.

13. A beam forming system comprising:
an antenna array system comprising multiple antenna elements configured to receive multiple signals; and
a processor downstream of said antenna array system, wherein said processor comprises a multiplication unit downstream of said antenna array system, wherein said multiplication unit is configured to apply a weighting vector to said signals, and an adder downstream of said multiplication unit, wherein said adder is configured to combine said signals into a beam comprising a beam peak in a first direction, a first null in a second direction different from said first direction, a second null adjacent to said first null and a third null in a third direction different from said first and second directions, wherein said first and second directions are substantially 2 degrees apart in angle, wherein a first null width, at a radiation power below 50 dB from said beam peak, covering multiple nulls comprising said first and second nulls is greater than a second null width, at said radiation power, covering a single null that is said third null.

14. The beam forming system of claim 13 further comprising an optimizer coupled to said processor, wherein said optimizer is configured to calculate said weighting vector.

15. The beam forming system of claim 13, wherein said processor comprises a digital signal processor.

16. A beam forming system comprising:
an antenna array system comprising multiple antenna elements configured to receive multiple signals; and
a processor downstream of said antenna array system, wherein said processor comprises a multiplication unit downstream of said antenna array system, wherein said multiplication unit is configured to apply a weighting vector to said signals, and an adder downstream of said multiplication unit, wherein said adder is configured to combine said signals into a beam comprising a peak of a main lobe in a first direction, a first null in a second direction different from said first direction, a second null adjacent to said first null by an angle less than 0.5 degrees and a peak of a side lobe between said first and second nulls in angle, wherein said peak of said side lobe is at a gain level below greater than 40 dB from said peak of said main lobe.

17. The beam forming system of claim 16 further comprising an optimizer coupled to said processor, wherein said optimizer is configured to calculate said weighting vector.

18. The beam forming system of claim 16, wherein said processor comprises a digital signal processor.

19. The beam forming system of claim 16, wherein said second null is adjacent to said first null by said angle less than 0.3 degrees.

20. The beam forming system of claim 13, wherein said beam further comprises a fourth null in a fourth direction different from said first, second and third directions and a fifth null adjacent to said fourth null, wherein a third null width, at said radiation power, covering multiple nulls comprising said fourth and fifth nulls is greater than said second null width.

* * * * *